United States Patent [19]
Rust

[11] Patent Number: 5,670,415
[45] Date of Patent: Sep. 23, 1997

[54] METHOD AND APPARATUS FOR VACUUM DEPOSITION OF HIGHLY IONIZED MEDIA IN AN ELECTROMAGNETIC CONTROLLED ENVIRONMENT

[75] Inventor: Ray Dean Rust, Midlothian, Va.

[73] Assignee: DeposiTech, Inc., La Jolla, Calif.

[21] Appl. No.: 248,406

[22] Filed: May 24, 1994

[51] Int. Cl.$^6$ .................................................. H01L 21/20
[52] U.S. Cl. ................ 437/106; 204/192.32; 204/192.12
[58] Field of Search ................ 437/106; 204/192.32, 204/192.12

[56] References Cited

U.S. PATENT DOCUMENTS

| | | | |
|---|---|---|---|
| Re. 30,401 | 9/1980 | White | 204/192 N |
| 3,329,601 | 7/1967 | Mattox | 204/298 |
| 4,039,416 | 8/1977 | White | 204/192 N |
| 4,420,386 | 12/1983 | White | 204/192 N |
| 4,840,702 | 6/1989 | Schumacher, III | 156/643 |
| 5,045,166 | 9/1991 | Bobbio | 204/192.32 |
| 5,094,976 | 3/1992 | Iwabuchi | 437/160 |
| 5,147,520 | 9/1992 | Bobbio | 204/192.12 |
| 5,232,569 | 8/1993 | Nelson et al. | 204/192.2 |

OTHER PUBLICATIONS

Goldman, Patricia, "The Economics of Replacing Electroless Copper", *Circuitree*, Feb. 1994, pp. 12–18.

Rossnagel et al., "Metal ion deposition from ionized mangetron sputtering discharge", *J. Vac. Sci. Technol*, vol. 12, pp. 449–453, 1994.

*Primary Examiner*—Robert Kunemund
*Attorney, Agent, or Firm*—Peter K. Hahn

[57] ABSTRACT

A method and apparatus for vacuum depositing a coating onto a substrate are provided. The method includes the steps of: introducing an evaporant into a magnetically defined deposition region of a vacuum process chamber, ionizing the evaporant to form a plasma; generating a "magnetic bottle" magnetic field configuration to define the deposition region and to confine the plasma to the deposition region, further increasing the percentage ionization of the plasma to form a highly ionized media; creating a static dc electric field that is generally perpendicular to the magnetic field in the deposition region and parallel to the plane of the substrate; and then moving the substrate through the highly ionized media with the plane of the substrate and its direction of motion generally parallel to the magnetic field lines. The method of the invention is particularly suited to deposition of any atomistic evaporant onto intermediate-sized substrates.

21 Claims, 5 Drawing Sheets

METHOD AND APPARATUS FOR VACUUM DEPOSITION OF HIGHLY IONIZED MEDIA IN AN ELECTROMAGNETIC CONTROLLED ENVIRONMENT

FIELD OF THE INVENTION

This invention relates generally to vacuum deposition and particularly to an improved method and apparatus for charged particle plating onto a substrate in a controlled environment.

BACKGROUND OF THE INVENTION

Vacuum processes can be used to deposit organic and inorganic materials onto substrates. The vacuum deposition of metal coatings, for example, is widely used in the manufacture of various articles, ranging from jewelry to automobiles. Electronic and microelectronic manufacturing are particularly dependent upon vacuum deposition.

Recently, vacuum deposition processes have been proposed as a technically superior and less expensive alternative to wet chemical metallization techniques for medium technology manufacturing. In the past, wet chemical metallization has been used in medium technology manufacturing to deposit metals onto dielectric substrates (i.e., workpieces). Typically these substrates are formed as intermediate sized panels (e.g.,600×800 mm). One problem with wet chemical metallization for coating dielectric substrates is that it is an expensive process that requires surface pretreatment and catalyzation prior to metal deposition. In addition, wet chemical metallization processes involve toxic chemicals that must be used and disposed of in a manner that minimizes atmospheric and ground water pollution.

In general, vacuum deposition processes can be divided into three categories: vacuum evaporation, sputtering and ion plating. Vacuum evaporation is a thermal process carried out in a vacuum chamber containing a substrate and a gaseous deposition species. A heating element (e.g., filament, electron beam, hot plate) heats and vaporizes a solid material to form an evaporant cloud. Because of the proximity of the evaporant to the substrate and the influence of the vacuum, evaporant molecules strike the substrate and solidify to form a coating.

One shortcoming of vacuum evaporation processes is the lack of adhesion of the coating to the substrate. This is because the evaporant is formed by simply vaporizing a deposition species and therefore the evaporant particles possess a relatively low kinetic energy. Furthermore, there is no particle acceleration into the substrate and consequently the evaporant particles impact the substrate with very little momentum resulting in poor adhesion to the substrate. In addition, vacuum evaporation processes require a "line-of-sight" between the evaporant cloud and the substrate. Uniformity may be a problem because the quality and thickness of the deposited coating varies with the angle of incidence of the evaporant particles from the evaporant cloud to the substrate. In order to deposit coatings with a uniform thickness, the substrate must be rotated. Typically, this involves the use of transport mechanisms that support the substrate as it is moved in a rotary, linear or planetary motion with respect to the source.

Sputtering, another type of vacuum deposition process, is a physical process that can be used to deposit a variety of metallic and dielectric materials onto a wide range of substrates. In sputtering, material is removed from a source or target (i.e., the cathode) by bombardment of a plasma. This material is deposited on the surface of the substrate which may be cathodic or floating with respect to the cathode. The plasma is formed of an inert gas, typically argon, and comprises mobile, positively and negatively charged particles. The plasma may be generated by an externally applied dc or rf field that supplies energy to the inert gas to remove an outer shell electron and produce separate positive and negative charged particles. Magnetic fields are also utilized to increase the effectiveness of the argon ions in removing material from the target (i.e., magnetron sputtering).

Sputtering is the most common alternative to vacuum evaporation. In general, sputtering improves the adhesion of the coating to a substrate because atoms extracted from the target by bombardment have more kinetic energy than those from an evaporation source. These energetic particles strike the substrate with sufficient energy to embed themselves in the substrate and to form a coating with good adhesive characteristics. A disadvantage of sputtering is that the inert gas which forms the plasma is often included in the deposited coating and may adversely affect the properties of the coating. In addition, deposition rates with sputtering are slower than vacuum evaporation and equipment is more expensive and complicated.

With ion plating, a third type of vacuum deposition process, an evaporant passes through a dc inert gas plasma, typically argon, and is ionized. A small fraction of ionized evaporant is accelerated to the surface of the substrate which is the cathode (negative electrode) of the dc plasma discharge. Typically a negative bias of several thousand volts with respect to the plasma is applied to the substrate. Ion plating, like sputtering, is not limited to line-of-sight deposition and provides superior adhesion over vacuum evaporation. In addition, for many applications, the substrate need not be rotated to achieve adequate coating uniformity and a wide variety of materials can be deposited.

Disadvantages of ion plating include its expense, the difficulty in masking parts from the deposition ions, and the damage to the substrate and coating from continuous bombardment by the accelerated ions.

Another vacuum deposition process termed "gasless ion plating" is a combination of evaporation and ion plating. Such a process is disclosed in U.S. Pat. No. 4,039,416; 4,420,386 and Re. 30,401 to Gerald W. White. With this deposition process, a plating material is vaporized and simultaneously subjected to ionization in a vacuum environment. The substrate is biased by an external dc source. A "virtual" cathode is created near the substrate using a rf power supply. The rf power supply is connected to the substrate to form a plasma of ionized atoms from the evaporant. The ionization during evaporation enhances deposition onto the substrate. This technique is termed "gasless" because the plasma is formed solely from the evaporant and does not require an inert gas to be maintained.

Although the vacuum deposition processes disclosed in the White patents provide enhanced deposition, the uniformity of the deposited coating over large areas is still a problem. Furthermore, the magnetic field configurations used at the substrate generate local regions on the substrate of non uniform deposition and increased heating. These nonuniformities will adversely effect the quality and properties of the deposited coating. Temperature sensitive substrates are particularly susceptible to the effects of localized heating.

In general, prior art vacuum deposition processes have not been successful in replacing wet chemical metallization processes for plating intermediate-sized workpieces. This failure is due, in part, to the lack of systems integration and optimization in vacuum process equipment that is available for the cost-driven, medium technology metallization market. Additionally, current vacuum metallization processes for dielectric workpieces require capital intensive processing equipment. Vacuum metallization equipment typically costs 5 to 10 times its wet chemical counterpart. In view of the foregoing, the need still exists for a method and apparatus of vacuum metallization which will economically satisfy medium technology manufacturing needs.

Accordingly, it is an object of the present invention to provide an improved method and apparatus for vacuum deposition of highly ionized media in an electromagnetic controlled environment suitable for coating substrates with a high degree of uniformity and adhesion. It is a further object of the present invention to provide an improved method and apparatus for vacuum deposition of highly ionized media in an electromagnetic controlled environment that is adaptable to large scale, medium technology manufacturing. It is yet another object of the present invention to provide an improved method and apparatus for vacuum deposition of highly ionized media in an electromagnetic controlled environment that is less expensive and more efficient than prior art wet chemical metallization processes for intermediate-sized substrates.

SUMMARY OF THE INVENTION

In accordance with the present invention an improved method and apparatus for vacuum deposition of highly ionized media in an electromagnetic controlled environment are provided. The method of the invention, broadly stated, includes the steps of: generating a deposition region defined by a magnetic field configuration in the shape of a "magnetic bottle" where, in the central region of the "magnetic bottle", the magnetic field is essentially parallel to the plane of the substrate; generating a deposition species in a vacuum chamber to form a media that traverses the central region of the "magnetic bottle"; ionizing the media as it traverses a central region using an external power source to create a highly ionized media confined within the "magnetic bottle"; establishing an electric field perpendicular to magnetic field lines in the central region of the "magnetic bottle" to control the deposition rate and energy with which the highly ionized media impacts the substrate; and then moving the substrate into and through the plasma confined within the "magnetic bottle" with a direction of motion and plane of the substrate essentially parallel to the magnetic field lines in the central region of the "magnetic bottle".

The steps of generating a deposition species and the ionization of that species within the "magnetic bottle" produce a highly ionized media that is for the most part confined within the "magnetic bottle". The application of an electric field essentially perpendicular to the magnetic field of the "magnetic bottle", and parallel to the plane of the substrate, controls the concentration and directional movement of the highly ionized media into the substrate to enhance the deposition process. In addition, the path of the substrate through the plasma, as well as its placement with respect to the electric and magnetic fields and to the source of the media, provides further control of the deposition process. Using the method of the invention, a coating can be applied simultaneously to both sides of a substrate with a high degree of adhesion and uniformity. The method of the invention is particularly suited to the metallization of masses of workpieces for medium technology manufacturing. As a example, the method is suitable for coating intermediate-sized rectangular-shaped dielectric panels with a conductive metal.

An apparatus constructed in accordance with the invention, broadly stated, includes: a vacuum process chamber made of non magnetic material; a source for producing an evaporant; water-cooled electrodes coupled to an external power source for ionizing the evaporant to produce a highly ionized media; magnetic field coils (or permanent magnets) surrounding the process chamber for generating the "magnetic bottle" magnetic field configuration; and a carrier for moving the workpieces into and through the highly ionized media in a direction generally parallel to the magnetic field lines in the central region of the "magnetic bottle".

The vacuum process chamber is connected to a vacuum source and has a rectangular cross-sectional configuration suitable for accommodating intermediate-sized rectangular workpieces. The evaporant source is mounted within the process chamber, or the evaporant is transported into the chamber, so as to provide evaporant at a high rate. Water-cooled electrodes, mounted within the process chamber on either side of the evaporant source, are coupled to an external power source to ionize the evaporant (plasma). The plasma is retained within a deposition volume defined by the central region of the "magnetic bottle". The water-cooled electrodes are mounted within the deposition volume, and due to the magnetic confinement of the plasma, the percent of ionization is increased creating a highly ionized media. The application of an electric field perpendicular to the magnetic field of the "magnetic bottle" controls the directional movement and concentration of the highly ionized media to enhance the deposition process. Discrete driving units support and drive the workpiece carrier and workpieces into and through the deposition volume along a predetermined path that is generally parallel to the electric and magnetic field lines in the central region of the "magnetic bottle". The driving units are located so that there is no structure to interfere with the deposition of the highly ionized media onto the workpiece.

During operation of the apparatus, the workpieces are loaded into the workpiece carrier. The carriers are fed singly into and through the deposition volume of the process chamber and then unloaded. This is accomplished by either loading the workpiece carriers in a loading station or a magazine so that the process chamber can be sealed and outgassed. The workpiece carriers are then advanced singularly through the deposition area for a predetermined period of time to deposit the highly ionized media of a desired thickness on both sides of the workpiece. Alternately the process chamber may be constructed with several deposition areas so that the workpiece is coated in layers having a desired overall thickness or to increase throughput. Following deposition of the coating, the deposition process is terminated and the workpiece carriers are moved into the same (or another) magazine while the remaining workpiece carriers are processed.

Other objects, advantages and capabilities of the present invention will become more apparent as the description proceeds.

DETAILED DESCRIPTION OF THE PREFERRED EMBODIMENT

Figure 1:
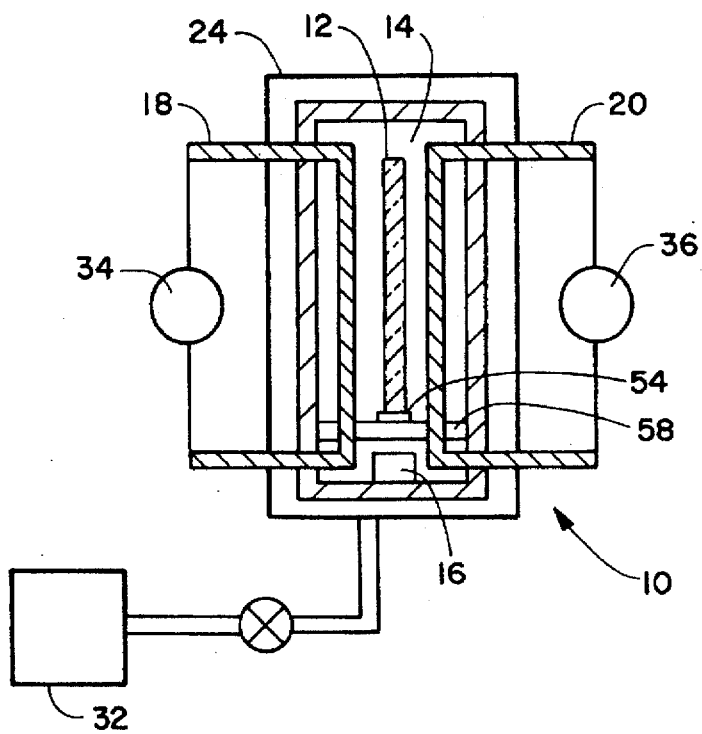
FIG. 1 is a schematic cross-sectional view of a vacuum deposition apparatus constructed in accordance with the invention for deposition of highly ionized media in an electromagnetic controlled environment.
Figure 2:
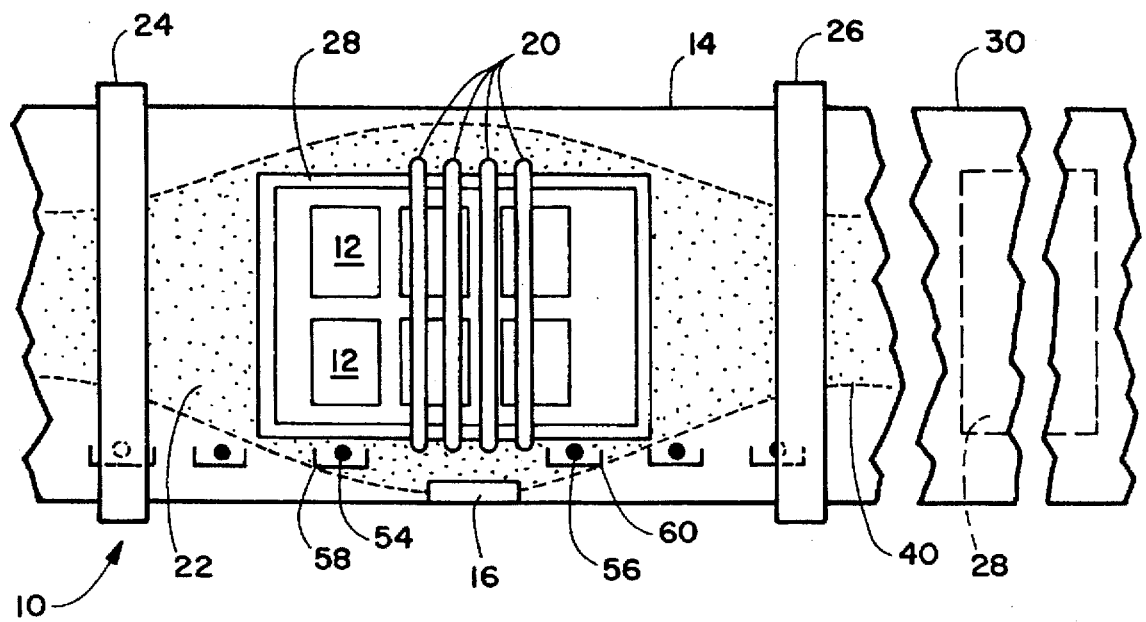
FIG. 2 is a schematic side elevation view of the apparatus shown in FIG. 1.

Referring now to FIGS. 1 and 2, a vacuum deposition apparatus 10 constructed in accordance with the invention is shown. The vacuum deposition apparatus 10 is adapted to coat a workpiece 12 with a highly ionized media. The workpiece 12 is one or more flat panels having a generally rectangular peripheral configuration. By way of example and not limitation, the workpiece or pieces may be mounted in a workpiece carrier 28 that is intermediate sized (e.g., from 100 mm to 1400 mm on a side) as might be used in a medium technology metallization process (e.g., MCM-L, PCB). Furthermore, the workpiece 12 may be either a dielectric or a conductive material or a composite of both. The vacuum deposition apparatus 10 may be used to coat the workpiece with a metal or a non-metallic deposition species. In general, any deposition species that can be vaporized may be deposited.

The vacuum deposition apparatus 10, broadly stated, includes: a vacuum process chamber 14; a metallization source 16 for producing an evaporant; pairs of water-cooled electrodes 18, 20 on each side of the vacuum process chamber 14 for ionizing the evaporant to produce a plasma 22 (FIG. 2); a set of magnetic field coils 24, 26 surrounding the process chamber 14 for generating magnetic field lines 40 (FIG. 3) in a "magnetic bottle" configuration that confines and increases the level of ionization of the plasma 22; a workpiece carrier 28 (FIG. 2) for moving the workpiece(s) 12 through the process chamber 14 at a predetermined orientation with respect to the magnetic field lines 40; and a loading and unloading station or magazine 30 (FIG. 2) to permit easy transport of the workpiece carrier 28 into and out of the process chamber 14.

The vacuum process chamber 14 has a generally rectangular cross-sectional configuration to accommodate the generally rectangular shaped workpiece carrier 28. The vacuum process chamber 14 may be formed of a material such as non magnetic stainless steel or aluminum capable of withstanding the reduced pressure within the process chamber 14. The vacuum process chamber 14 is attached to a vacuum source 32 (FIG. 1), such as a mechanical forepump coupled with a diffusion or turbomolecular pump, adapted to generate reduced pressures within the chamber. By way of example, during operation of the vacuum deposition apparatus 10, vacuum pressures in the process chamber 14 will be on the order of $10^{-1}$ to $10^{-3}$ Torr with a base pressure of $10^{-6}$ to $10^{-8}$ Torr.

In the illustrative embodiment, the metallization source 16 is mounted within the vacuum process chamber 14 and is connected to an external power supply (not shown). For metal evaporation, the metallization source 16 is basically a heater adapted to vaporize a solid metal such as copper. A plating material is batch or continuously fed into the metallization source 16 as metallic chunks or as a ribbon or wire of the solid metal. This type of metallization source 16 is well known in the art and is commercially readily available.

Vaporized material from the metallization source 16 forms an evaporant cloud within the process chamber 14. This evaporant cloud is ionized by the electrodes 18, 20 to form the ionized plasma 22. The vaporization and ionization processes are continuous and simultaneous. Furthermore, process parameters are controlled such that the vaporization process remains in a steady state with the deposition of material onto the workpiece 12.

The placement of the metallization source 16 within the process chamber 14 is selected such that there are a minimum of obstructions between the metallization source 16 and the water-cooled electrodes 18, 20 located in the central region of the "magnetic bottle". The metallization source 16 is located below the workpiece 12 and the workpiece carrier 28 in the approximate center of the vacuum process chamber 14 and midway between the water-cooled electrodes 18, 20 and the confining magnetic field coils 24, 26. In addition, the face of the metallization source 16 is preferably, but not restricted to, along a plane that is generally perpendicular to the faces of the workpiece 12. Alternately in place of a metallization source 16 for forming an evaporant within the process chamber 14, the evaporant may be formed externally and imported into the process chamber 14.

In the illustrative embodiment, there are four water cooled electrodes 18 or 20 on each side of the process chamber 14. The water cooled electrodes 18, 20 are connected to one or more rf power sources 34, 36 (FIG. 1) electrically coupled so as to produce the most efficient ionization of the evaporant. The primary ionization of the evaporant forming the plasma 22 is produced by the local oscillating radio frequency field generated by the rf sources 34, 36. The most common frequencies used for the rf power sources 34, 36 are in the 10–100 kilohertz and 2–40 megahertz ranges at a power of from 2 to 10 kilowatts. In this regard, recent experiments are incorporated herein by reference, by S. M. Rossnagel and J. Hopwood of IBM Research, Yorktown Heights (J.Vac. Sci. Technol. B 12(1), Jan/Feb 1994, pp 449–453). In these experiments a variety of commercial, planar magnetrons were used with the addition of a high density, inductively coupled rf (RFI) plasma, to achieve 85% ionization of the sputtered metal ions.

The ionization of the evaporant in this invention is enhanced further by the presence of the magnetic field lines 40 of the "magnetic bottle". As used herein the term "magnetic bottle" refers to a deposition volume formed within the process chamber 14 by the magnetic field generated by the magnetic field coils 24, 26. The boundaries of the plasma 22, are defined by the "magnetic bottle" field configuration. These boundaries can be changed by varying the current to the magnetic field coils 24, 26. The bulk of the plasma 22 is confined by the magnetic field of the "magnetic bottle" to be between and surrounding the rf electrodes 18, 20. This confinement of the ionized evaporant by the "magnetic bottle" causes more collisions with neutral evaporant in the central deposition volume of the "magnetic bottle" and additionally increases the percent ionization of the evaporant beyond that generated by the rf electrodes alone, creating a highly ionized media. A deposition area thus forms within the process chamber 14 in the area between the electrodes 18, 20 and in the central volume of the "magnetic bottle" between the magnetic field coils 24, 26. Within this deposition volume deposition mechanics for coating the workpieces 12 are optimized.

As clearly shown in FIG. 1, the electrodes 18, 20 are tubular or elongated linear structures defining a plane disposed within the process cheer 14. The planes formed by the two sets of electrodes 18, 20 are oriented generally parallel to the plane of the workpiece 12 as it is moved by the workpiece carrier 28 through the process chamber 14. This generates an rf field centered between the magnetic field coils 24, 26 concentrically around the electrodes 18, 20 on both sides of the workpiece 12 and workpiece carrier 28. In addition, the linear extent of the electrodes 18, 20 is great enough to fully interact with the plasma 22 confined by the magnetic field lines of the "magnetic bottle". For example, the electrodes 18, 20 may extend above and below the upper and lower edges of the workpiece 12 and the workpiece holder 28, as illustrated in FIGS. 1 and 2.

Furthermore, separate sets of electrodes may be provided. One set of electrodes may primarily provide a dc field having a desired directionality. The other set of electrodes may primarily function to ionize the plasma.

The electrodes 18, 20 are water cooled in order to prevent excessive heating of the electrodes themselves and contamination into the system. In general the deposition process tends to generate heat at the workpiece 12. Nonuniform heating and excessive heating of the workpiece 12 tend to degrade the uniformity and quality of the deposited coating. The previously cited technical article by Rossnagel reported that under certain deposition conditions of metals, the addition of large fluxes of metal atoms tends to produce a cooling effect upon the plasma. The large flux of highly ionized media generated in this invention is therefore advantageous to minimize heat input into the system while providing large deposition rates.

The magnetic field coils 24, 26 (or alternately permanent magnets) surround the process chamber 14 and are located on either side of the electrodes 18, 20. The magnetic field coils 24, 26 are adapted to generate a "magnetic bottle" that generally confines the ionized evaporant (plasma) in the central region between the field coils 24, 26. As a part of this configuration, the magnetic field lines 40 in the central region of the "magnetic bottle" are oriented generally parallel to the faces of the workpiece 12 and to the plane of the workpiece 12. An electric field may be applied orthogonally to the magnetic field lines in the central region of the "magnetic bottle" to enhance and further control the deposition process.

Figure 3:
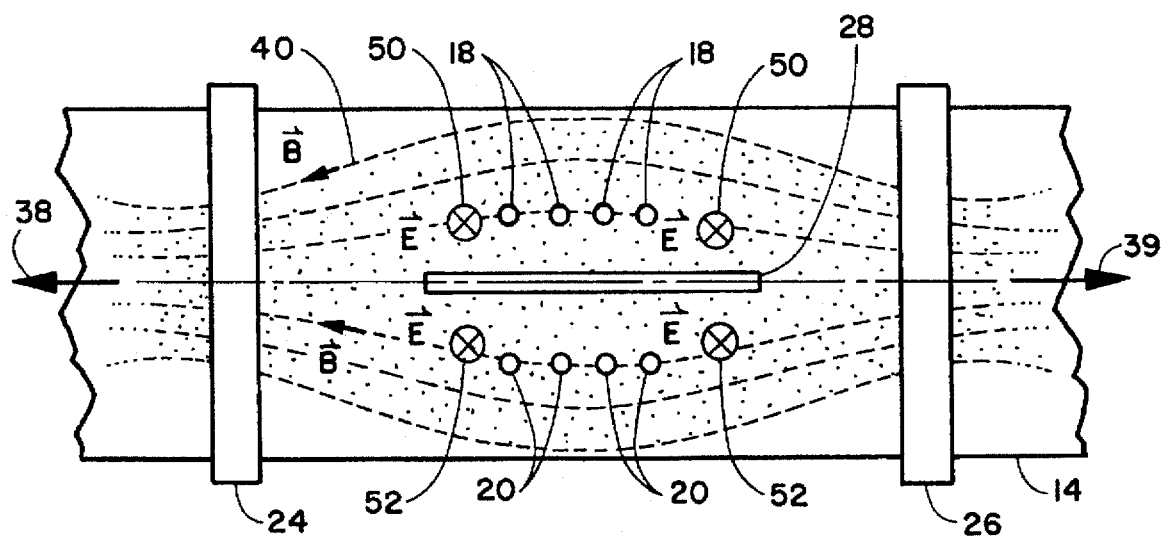
FIG. 3 is a schematic plan view showing a workpiece carrier and the configuration of the magnetic field lines comprising the "magnetic bottle" as it is moved through a vacuum deposition apparatus constructed in accordance with the invention.

This orientation of the electric and magnetic fields with respect to the workpiece 12 is shown schematically in FIG. 3. In FIG. 3, the workpiece carrier 28 is moved in a direction as indicated by arrow 38 or 39. The applied electric field, which is expressed mathematically by both magnitude and direction (a vector quantity at a specific spatial location) is indicated by the electric field vectors 52 and 50 which are directed into and out of the paper respectively.

Figure 4:
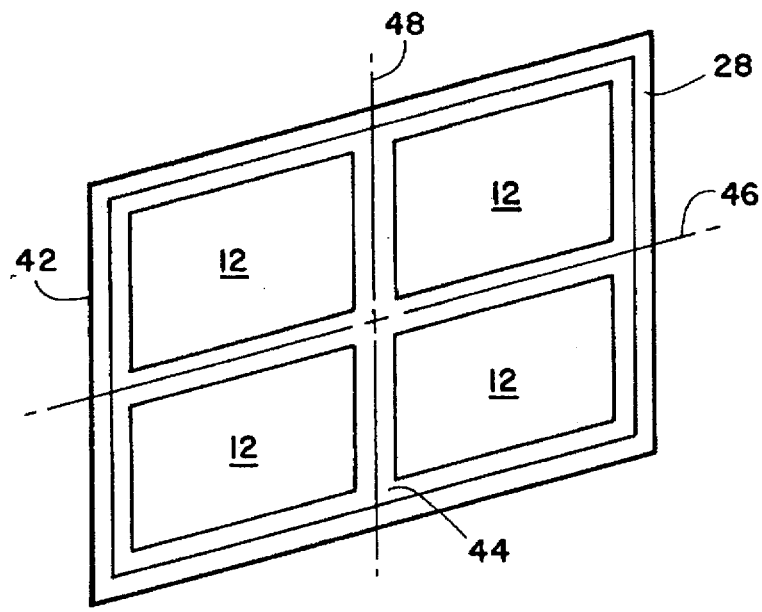
FIG. 4 is a perspective view of a rectangular workpiece suitable for coating in accordance with the invention.

As used herein the term "plane of the workpiece" refers to a plane that is parallel to the rectangular faces of the workpiece 12 and workpiece carrier 28. The workpiece carrier 28, which is shown separately in FIG. 4, is adapted to hold multiple workpieces 12. In the illustrative embodiment there are four workpieces 12 mounted in the workpiece carrier 28. The generally rectangular shaped workpiece carrier 28 includes a front face 44 and a parallel rear face 42. The plane of the workpiece carrier 28 is parallel to the front face 44 and to the rear face 42. In addition, the plane of the workpiece carrier 28 is parallel to the horizontal axis 46 and vertical axis 48 of the workpiece carrier 28.

The plasma 22 formed within the process chamber 14 contains neutral atoms, electrons and ions. Each of these species finds itself in a physical volume permeated with crossed electromagnetic fields. The neutral atoms are not affected by these fields since they are not electrically charged. It is the intent of the invention to minimize the number of neutral atoms in the deposition volume. This is accomplished by confining the electrons and ions in the deposition volume by means of a "magnetic bottle" such that the neutral atoms must traverse a region of high electron and ion density as they move into the "magnetic bottle". The higher particle density increases the probability of collision and hence ionization of the neutrals in the deposition volume.

Confinement, as used above, refers to the repeated movement along the magnetic field lines created by coils 24, 26 rather than line-of-sight motion. An object inserted into the "magnetic bottle" region along the central axis of the bottle will experience deposition of the ionized evaporant caused by the density gradient (decreasing away from the central axis). In FIG. 3, the central axis of the "magnetic bottle" is coincident to directional arrows 38 and 39.

Confinement and then deposition of the evaporant onto the substrate is accomplished by the physical arrangement and strengths of the magnetic and electric fields within the deposition volume. If the ions and electrons have a velocity component parallel with the magnetic field lines they move along the lines with that velocity. If they have a velocity component perpendicular to the magnetic field lines then they circle about the lines, rotating in opposite directions as shown in FIG. 5.

Figure 5:
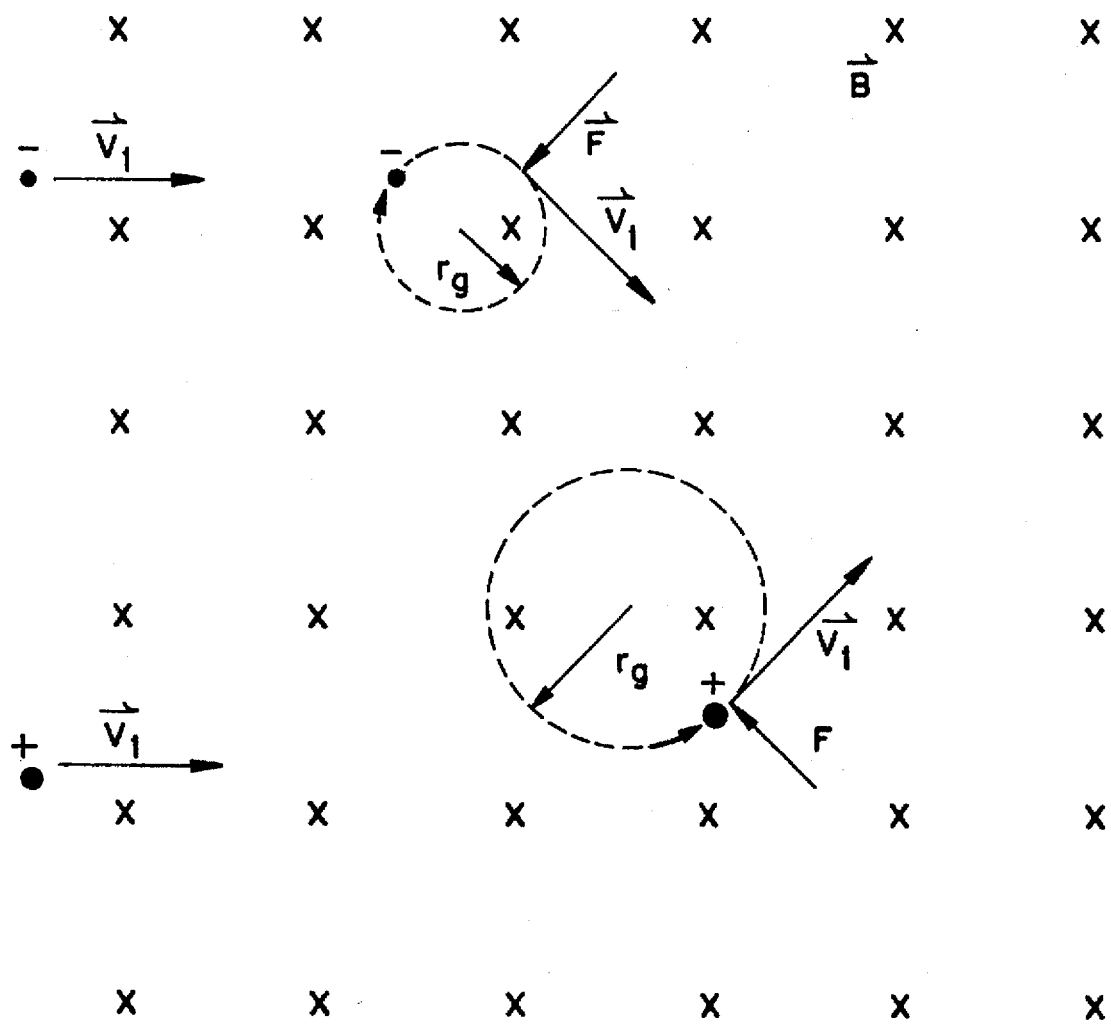
FIG. 5 is a diagram showing the forces and motion on a charged particle in a constant magnetic field.

In FIG. 5, the forces and motion on a charged particle in a constant magnetic field can be expressed by the formula:

$$F = Ze\,(V_1 \times B)$$
$$= -e\,(V_1 \times B) \text{ for electron}$$
$$= +e\,(V_1 \times B) \text{ for singly ionized ions}$$

$$r_g = mV_l/B\,(Ze/C)^{-1} \quad (c.q.s)$$

where

F is the force on a charged particle expressed as a vector quantity

Z is the state of ionization (1, 2 etc.)

e is the elementary charge

Figure 6:
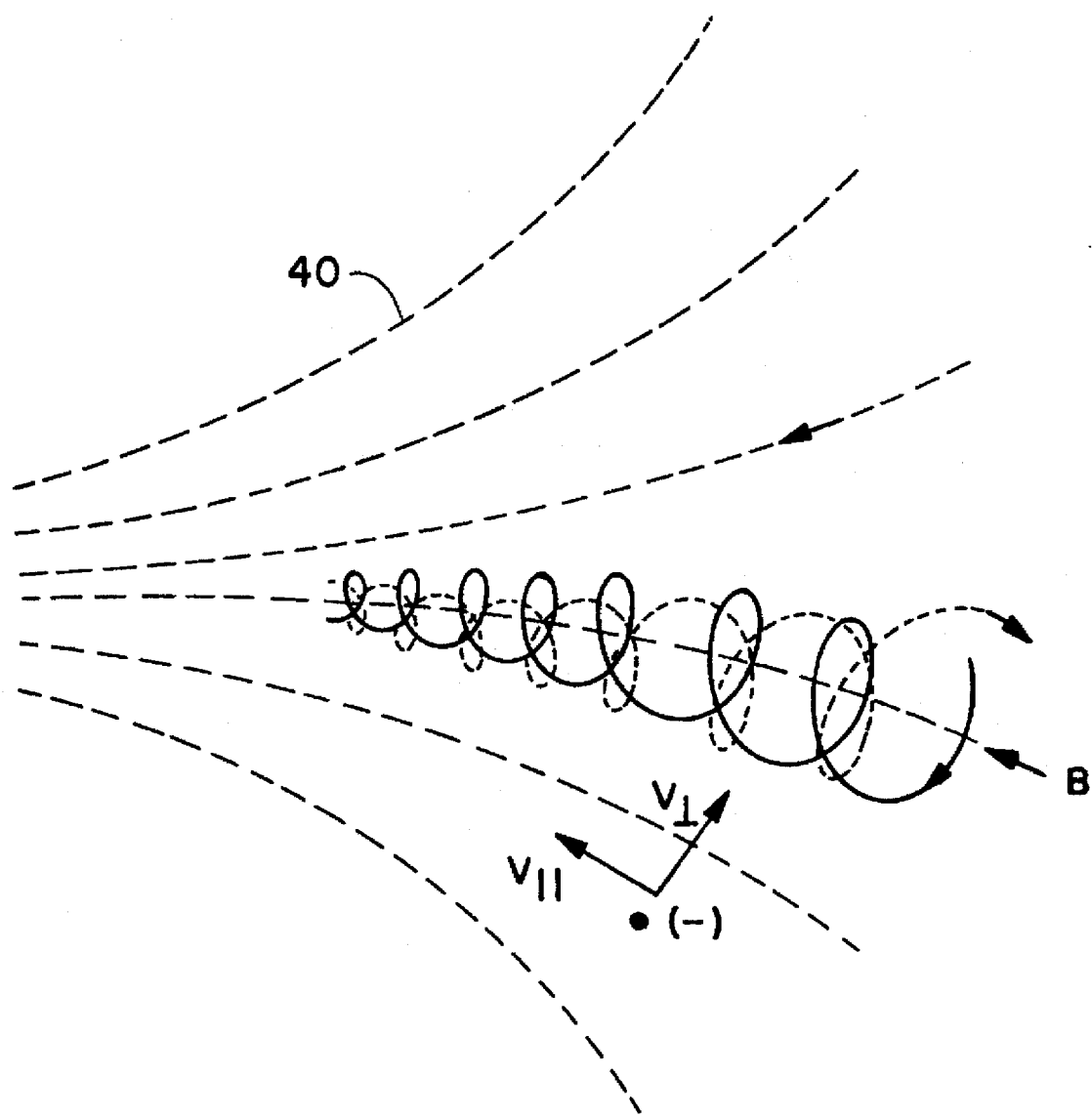
FIG. 6 is a diagram showing the reflection of a charged particle in a "magnetic mirror"; and, FIG. 7 is a diagram showing the motion of charged particles in an E cross B field configuration.

B is the magnetic field expressed as a vector quantity $V_1$ is the velocity component perpendicular to the magnetic field lines expressed as a vector quantity m is the charged particle mass $r_g$ is the position of observation at a distance of r When the ions and electrons come to a region of increasing magnetic field (such as under the field coils 24, 26), the region behaves as a "magnetic mirror" for both ions and electrons, reflecting them back along the magnetic field line as shown in FIG. 6. In FIG. 6

$$\mu = \text{current} \times \text{area} = ew_c/\pi 2 * \pi r_g^2 = \tfrac{1}{2} m V_1^2/B$$

where $\mu$ is the magnetic moment e is the elementary charge $V_l$ is the velocity component perpendicular to the magnetic field lines $v_{11}$ is the velocity component parallel to the magnetic field lines B is the magnetic field expressed as a vector quantity $W_c$ is the charged particle cyclotron frequency For $\mu$ to remain constant, $V_l^2$ must increase as a particle moves into a B field of increasing strength. Since $\tfrac{1}{2} m\,(V_{11}^2 + V_1^2)$ remains constant $V_{11}$ must decrease.

This reflection of ions and electrons under the magnetic field coils 24, 26 back into the region between them confines the ions and electrons in a "magnetic bottle". The confinement enhances collisions of ions and electrons with neutral atoms increasing the ionization level beyond that achieved by the rf electrodes alone.

When an electric field, E, is parallel with the magnetic field, B, the ions and electrons are accelerated in opposite directions along the B field by the force:

F=−eE (electrons)

F=+eE (singly ionized ions).

If the electric and magnetic fields are perpendicular to one another then the electrons and the ions move not only along the magnetic field lines with the velocity they have parallel to the field but they also move in a cycloid motion (electrons and ions in the same direction) perpendicular to both the E and B field directions. This is shown in FIG. 7.

Figure 7:
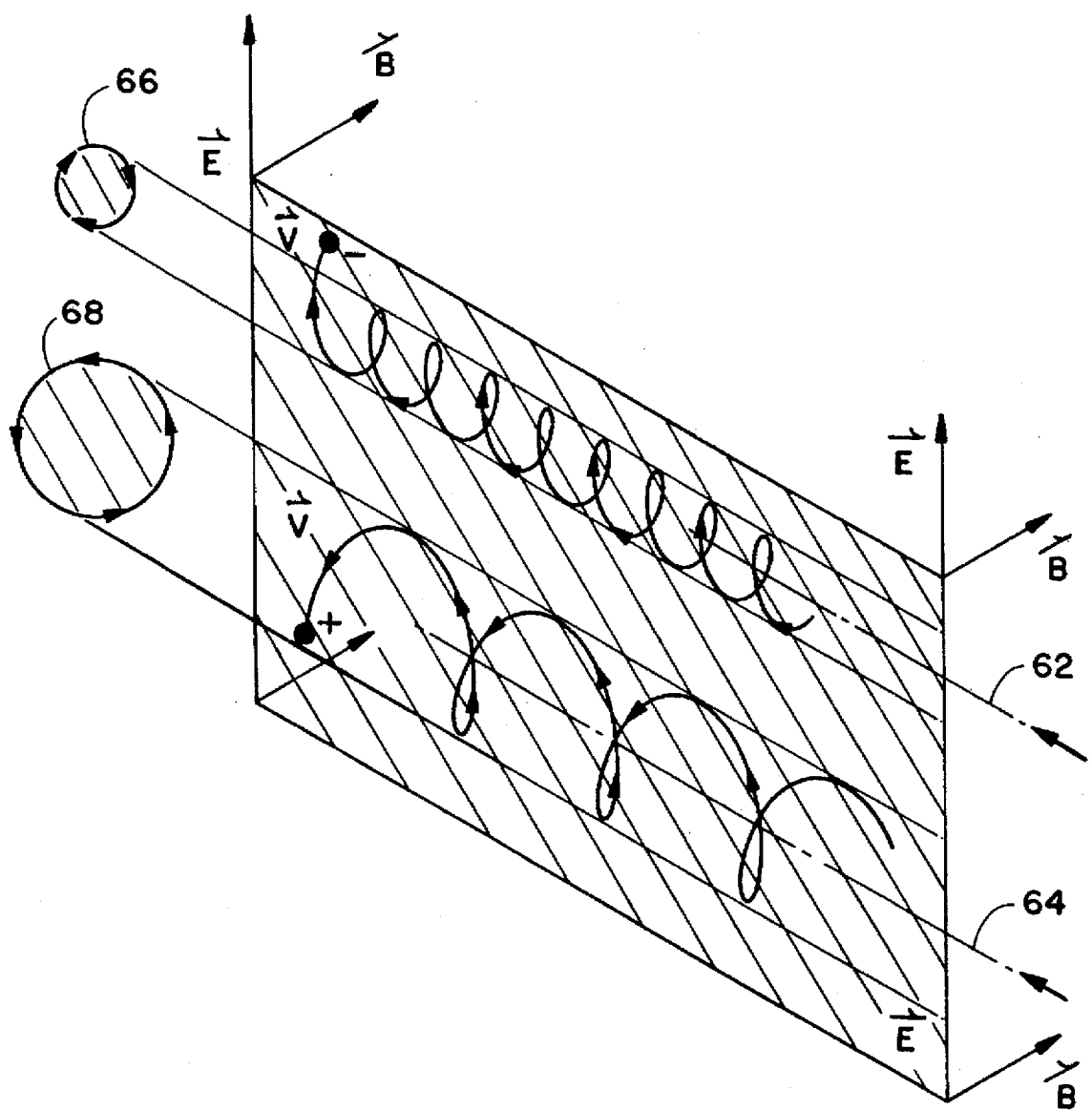

In FIG. 7, the particle orbiting around guiding center 62 is an electron. The particle orbiting around guiding center 64 is an ion. Motion in the absence of an E field is shown by circles 66, 68. In the presence of an E field, the motion for both an electron orbiting around guiding center 62 and an ion orbiting around guiding center 64 is cycloidal. In addition, the motion is along the guiding centers 62, 64 in the E×B direction. Drift occurs because $r_g$ changes as a particle circuits around its orbit. Velocity along a guiding center 62, 64 can be calculated by:

$$V_D = E \times B/[B]^2 = 10^8 E_\perp (\text{volt/cm})/B(\text{Gauss})(\text{in cm/sec})$$

where $V_D$ is the velocity along guiding center expressed as a vector quanity

E is the electric field strength expressed as a vector quantity $E_\perp$ is the perpendicular component of the electric field strength The "magnetic bottle" configuration alone will cause selective deposition into a workpiece located along the central axis of the "magnetic bottle". It is the selective use of the electric field perpendicular to the magnetic field lines 40 in the region of the workpiece 12 that enhances and changes the properties and rate of the deposition. By arranging the electric field to be parallel to the front faces 44 and rear faces 42 (FIG. 4) of the workpiece then the E cross B drift velocity will be directed into the workpiece, increasing the deposition rate.

The workpiece carrier 28 is adapted to move the workpiece 12 through the process chamber 14 with a specific orientation with respect to the electric and magnetic fields generated in the deposition area (i.e., parallel to both the electric and magnetic fields). In addition, the work piece carrier 28 is adapted to hold one or more workpiece(s) 12 (as shown in FIG. 4) in an upright vertical position and move it through the process chamber 14 for simultaneously plating both sides of the workpiece(s) 12. The workpiece carrier 28 is electrically floating so that it may be grounded or connected to a external bias needed for the most efficient deposition.

The workpiece carrier 28 is operably associated with a loading station or a magazine 30 (FIG. 2). Using the loading station each carrier 28 is loaded with workpieces 12 at the loading station exterior to the vacuum chamber 14. When the workpiece carrier 28 is loaded, the vacuum chamber 14, which is at atmospheric pressure, is opened and the single workpiece carrier 28 is moved into the chamber. Then the chamber 14 is sealed and evacuated. After processing the chamber 14 is returned to atmospheric pressure then the chamber 14 is opened and the workpiece carrier 28 is taken from the chamber 14 onto the loading station. Next, the chamber 14 is sealed, and the cycle is repeated.

In the case of a magazine 30 which is adapted to hold multiple workpiece carriers 28, the workpieces 12 are loaded into multiple workpiece carriers 28 which are then as a group loaded into the magazine 30. The magazine 30 and vacuum process chamber 14 form a sealed unit which permits processing of multiple workpiece carriers 28 without breaking vacuum. Structurally, the workpiece carrier 28 and magazine 30 are similar in construction to the transport mechanisms described in U.S. Pat. No. 4,840,702 to John E. Schumacher, III, which is incorporated herein by reference.

In magazine operation of the deposition apparatus 10, workpieces 12 are loaded into the workpiece carriers 28, and the carriers are batch loaded into the magazine 30. Following sealing and outgassing of the vacuum process chamber 14 and magazine 30, individual workpiece carriers 28 are automatically transferred in sequence into and through the deposition volume of the process chamber 14. Each workpiece carrier 28, containing one or more plated workpieces 12 is then transported back to the magazine 30 and the process is repeated until all of the workpiece carriers 28 in the magazine 30 have been processed. The workpiece carrier 28 forms a picture frame about each workpiece 12 contacting just the edges of the workpiece 12 so that the parallel rectangular faces 42, 44 (FIG. 4) of the workpiece 12 are exposed for plating. The workpiece carrier 28 is driven in a linear direction by multiple discrete drive units 54, 56 (FIG. 2). The drive units 54, 56 are formed as toothed drive sprockets driven by electric motors, or an equivalent drive means, and are adapted to contact and drive the workpiece carrier 28 and workpiece(s) 12 at a predetermined rate which is controllable by the operator.

The drive units 54, 56 are located below the work piece carrier 28. In addition, the drive units 54, 56 are spaced from one another to provide an open area there between for the metallization source 16. With this arrangement there are no physical obstructions between the evaporant source and the central deposition region of the "magnetic bottle". Additionally there are no physical obstructions between the plasma 22 and the faces 42, 44 of the workpiece 12. The discrete drive units 54, 56 have deposition shields 58, 60 that protect the drive units 54, 56 from line-of-sight deposition from the evaporant source 16.

The arrangement of the drive units 54, 56 and metallization source 16, as well as the placement of the electrodes 18, 20 and magnetic field coils 24, 26, is intended to provide a deposition volume within the process chamber 14 in which the deposition process is optimized. Furthermore, two or more deposition volumes can be formed in the process chamber 14 by duplication of these components in series. Such an arrangement can be used to obtain a desired deposition thickness and workpiece 12 throughput.

OPERATION

In operation of the vacuum deposition apparatus 10, several workpiece carriers 28 are batch loaded into the magazine 30. The magazine 30 and process chamber 14 are sealed and outgassed to a desired base pressure (e.g., $10^{-6}$ to $10^{-8}$ Torr). The "magnetic bottle" is created by energizing the magnetic field coils 24, 26. The plasma 22 is formed in the process chamber 14 by the metallization source 16 and electrodes 18, 20. The workpiece carriers 28 are then transported individually from the magazine 30 into and through the process chamber 14. The workpiece carrier 28 holds the workpieces 12 in a vertical position as it is moved through the plasma 22. As previously described, the orientation of the workpiece 12 with respect to the magnetic field lines 40 (FIG. 3) and applied dc electric field vectors 50, 52 (FIG. 3) is intended to enhance the deposition process onto the workpiece 12.

The workpiece carrier 28 is moved through the plasma 22 at a predetermined rate and for a predetermined time period to achieve a coating on both sides having a desired thickness. Following the deposition process, the workpiece carrier 28 is moved back into the magazine 30 to await processing of the remaining workpiece carriers 28. Alternately a separate magazine (not shown) may be provided for receiving and unloading the coated workpiece(s) 12 in the workpiece carriers 28.

Thus the invention provides an improved method and apparatus of highly ionized media deposition especially suited to the metallization of intermediate-sized dielectric panels. Some specific improvements over the prior art include the generation of a "magnetic bottle" which defines a deposition volume within the process chamber 14. The placement of the electrodes 18, 20 within the "magnetic bottle" creates a highly ionized media more efficiently than prior art virtual electrodes at the workpieces. Additionally, the vertical orientation of the electrodes 18, 20 above and below the workpiece carrier 28, and the horizontal transport of the workpiece carrier 28 through the deposition area of the process chamber 14 produces better deposition control ad uniformity. This arrangement also allows both sides of the workpiece 12 to be coated simultaneously. Furthermore, the "magnetic bottle" field configuration produced by coils 24, 26 maximize the ionization process yet reduce the heating of the substrate by extraneous electron bombardment.

While the invention has been described with reference to certain preferred embodiments, as will be apparent to those skilled in the art, certain changes and modifications can be made without departing from the scope of the invention as defined by the following claims.

What is claimed is:

1. A method of vacuum depositing a coating on a substrate, comprising:
   providing an evaporant in a vacuum process chamber;
   ionizing the evaporant using an external power source to form a plasma within the process chamber;
   generating a non-uniform magnetic field within the process chamber having the configuration of a "magnetic bottle" to contain the plasma; and then
   moving the substrate into a deposition volume of the "magnetic bottle" along a direction of motion generally parallel to a primary axis of the "magnetic bottle" within the deposition volume to deposit the coating on the substrate to a desired thickness.

2. The method as recited in claim 1 wherein said substrate has a face establishing a plane and wherein the ionized evaporant is subjected to a dc electric field, said electric field having field vectors oriented generally in a plane parallel to said plane of said substrate face, said field vectors being oriented generally perpendicular to magnetic field lines.

3. The method as recited in claim 1 and wherein the material is evaporated using a metallization source adapted to heat and vaporize a solid metal.

4. The method as recited in claim 1 and wherein the substrate is a generally rectangular-shaped panel having front and rear faces oriented generally parallel to the primary axis of the "magnetic bottle" and both faces are simultaneously coated.

5. The method as recited in claim 1 and wherein the substrate is moved through the plasma by an electrically biasable carrier.

6. A method for vacuum depositing a coating on a substrate comprising:
   vaporizing a deposition species in a vacuum process chamber to form an evaporant;
   forming a plasma by ionizing the evaporant using an external power source with electrodes located within the process chamber;
   generating a non-uniform magnetic field throughout the process chamber which contains the plasma and acts as a barrier to high energy electrons in the plasma striking the substrate said magnetic field having a primary axis;
   subjecting the ionized evaporant to a dc electric field with field vectors oriented generally perpendicular to the primary axis of the magnetic field and parallel to a face of the substrate; and then
   moving the substrate through the plasma along a direction of motion generally parallel to the primary axis of the magnetic field to deposit the coating on the substrate to a desired thickness.

7. The method a recited in claim 6 and wherein the external power supply for the ionizing electrodes is a radio frequency source.

8. The method a recited in claim 6 and wherein the magnetic field is applied by a magnet surrounding the process chamber.

9. The method as recited in claim 6 and wherein the substrate is a generally rectangular-shaped panel having parallel faces oriented generally parallel to magnetic field lines as the substrate is moved through the plasma.

10. The method as recited in claim 9 and wherein the substrate is a dielectric and the deposition species is a metal.

11. The method as recited in claim 6 and wherein the substrate is conductive and is coupled to an external bias source.

12. The method as recited in claim 6 and wherein the deposition species is a metal vaporized using a metallization source.

13. The method as recited in claim 9 wherein the substrate is selected from the group consisting of a metal, a dielectric and a dielectric partially covered with metal and the deposition species is a dielectric.

14. The method as recited in claim 13 and wherein the substrate is intermediate-sized panel from about 100 mm to about 1400 mm on a side.

15. A method of vacuum deposition for plating a substrate having an exposed face with a metal, comprising:
   evaporating the metal in a vacuum process chamber to form an evaporant;
   ionizing the evaporant to form a plasma using electrodes mounted within the process chamber coupled to a rf power source;
   generating magnetic field lines in the process chamber to provide a barrier to high energy electrons in the plasma striking the substrate;
   subjecting the ionized evaporant to a dc electric field having electric field vectors oriented generally perpendicular to the magnetic field lines in a deposition volume; and then
   moving the substrate through the deposition volume on an electrically biasable carrier with a face of the substrate held by the carrier generally parallel to the magnetic field lines to deposit the metal onto the face.

16. The method as recited in claim 15 and wherein the metal is evaporated using a metallization source placed below the substrate carrier.

17. The method as recited in claim 15 and wherein the magnetic field lines are generated by magnetic field coils placed around the process chamber.

18. The method as recited in claim 15 and wherein the magnetic field lines are generated by permanent magnets placed around the process chamber.

19. The method as recited in claim 15 and wherein planes formed by a surface of the electrodes are generally parallel to one another and to a face of the substrate.

20. The method as recited in claim 15 and wherein the electrodes extend above and below the substrate.

21. The method as recited in claim 15 and wherein the electrodes are water cooled.

* * * * *